United States Patent

Ramos et al.

[11] Patent Number: 6,119,927
[45] Date of Patent: Sep. 19, 2000

[54] METHOD AND APPARATUS FOR PLACING AND ATTACHING SOLDER BALLS TO SUBSTRATES

[75] Inventors: Richard Ramos, La Habra; Paul W. Barnes, Walnut, both of Calif.

[73] Assignee: EDM Supplies, Inc., Downey, Calif.

[21] Appl. No.: 09/027,042

[22] Filed: Feb. 18, 1998

Related U.S. Application Data

[60] Provisional application No. 60/038,097, Feb. 18, 1997, provisional application No. 60/071,751, Jan. 16, 1998, and provisional application No. 60/073,964, Feb. 6, 1998.

[51] Int. Cl.[7] .............................. B23K 35/12; B23K 3/02; B23K 28/00; B23K 31/02; B23K 35/38
[52] U.S. Cl. ............................ 228/254; 228/54; 228/202; 228/219; 228/220; 228/221; 228/222; 228/246
[58] Field of Search .............................. 228/54, 219, 220, 228/221, 246, 202, 222, 254

[56] References Cited

U.S. PATENT DOCUMENTS

| | | | |
|---|---|---|---|
| 3,719,981 | 3/1973 | Steitz | 29/423 |
| 4,460,108 | 7/1984 | Noda et al. | 221/94 |
| 5,118,027 | 6/1992 | Braun et al. | 228/180.2 |
| 5,219,117 | 6/1993 | Lin | 228/253 |
| 5,279,045 | 1/1994 | Odashima et al. | 34/10 |
| 5,324,569 | 6/1994 | Nagesh et al. | 428/198 |
| 5,356,838 | 10/1994 | Kim | 437/226 |
| 5,431,332 | 7/1995 | Kirby et al. | 228/246 |
| 5,499,487 | 3/1996 | McGill | 53/473 |
| 5,551,627 | 9/1996 | Leicht et al. | 228/180.22 |
| 5,601,229 | 2/1997 | Nakazato et al. | 288/246 |
| 5,685,477 | 11/1997 | Mallik et al. | 228/254 |
| 5,735,452 | 4/1998 | Yu et al. | 228/254 |

OTHER PUBLICATIONS

Scientific Sealing Technology, Downey, California, "Enhanced Vacuum Process Furnace Model MV–2200" brochure, 2pp.

Alpha Metals, Inc., Jersey City, New Jersey, "Coplanarity Issues for Ball Grid Arrays as Affected by Solder Spheres/Bumping," Application Bulletin SM–473–1, 2pp.
Alpha Metals, Inc., Jersey City, New Jersey, "Aqualine™ WS609 BGAFLUX," Technical Bulletin SM–480, 2pp.
Alpha Metals, Inc., Jersey City, New Jersey, "Aqualine™ WS613 BGFLUX," Technical Bulletin SM–481, 2pp.
Alpha Metals, Inc., Jersey City, New Jersey, "Guideline™ RMA376EH BGAFLUX," Technical Bulletin SM–482, 2pp.
Alpha Metals, Inc., Jersey City, New Jersey, "Cleanline™ LR735 BGAFLUX," Technical Bulletin SM–483, 2pp.
Alpha Metals, Inc., Jersey City, New Jersey, "Solder Spheres Technical Data," Technical Bulletin SM–485, 2pp.

(List continued on next page.)

*Primary Examiner*—Patrick Ryan
*Assistant Examiner*—Zidia J. Pittman
*Attorney, Agent, or Firm*—Christie, Parker & Hale, LLP

[57] ABSTRACT

A method and apparatus for placing and attaching solder balls to a substrate having conductive pads in a predetermined pattern is disclosed. The substrate is placed on a carrier plate. An alignment plate having holes corresponding to the predetermined pattern is mated to the carrier plate with its holes aligned with the predetermine pattern on the substrate. Solder balls are loaded into each hole of the alignment plate. The solder balls may be loaded with a vacuum plate which uses vacuum to pick up solder balls in the predetermined pattern and place them over the holes on the alignment plate. The vacuum is released for dropping the balls in the holes of the alignment plate. Alternatively a shutter plate having holes corresponding to the holes on the alignment plate is fitted on the alignment plate and afforded slidable movement between an offset position and an aligned position. A ball is loaded in each hole in the shutter plate when it is in its offset position. The shutter plate is then slid its aligned position wherein its holes are aligned with the holes on the alignment plate causing the balls to drop into the holes on the alignment plate and onto a conductive pad of the substrate. The assembly of carrier and alignment plate is then heated in a non-oxidizing atmosphere in a furnace causing the solder balls to reflow and attach to the pads on the substrate.

23 Claims, 11 Drawing Sheets

OTHER PUBLICATIONS

Alpha Metals, Inc., Jersey City, New Jersey, "Solder Sphere Quality Assurance," Technical Bulletin SM–486, 2pp.

Alpha Metals, Inc., Jersey City, New Jersey, "ESD Solder Sphere Packaging," Technical Bulletin SM–487, 2pp.

Alpha Metals, Inc., Jersey City, New Jersey, "Solder Sphere Oxidation," Application Bulletin SM–488, 1pp.

Alpha Metals, Inc., Jersey City, New Jersey, "Bumping BGA Packages: Solder Sphere/Paste Reflow," Application Bulletin SM–489, 2pp.

Alpha Metals, Inc., Jersey City, New Jersey, "BGA Package Solder Bump Quality," Application Bulletin SM–490, 2pp.

Bulwith et al., "Solder Sphere Concerns in Grid Array Bumping," Alpha Metals, Inc., Jersey City, New Jersey, 8pp.

Denlinger et al., "Reliable and Economical Assembly of Hybrid Microelectronic Packages," Scientific Sealing Technology, Downey, California, 6pp.

Rooks, "Controlling BGA Assembly Using X–Ray Laminography," *Electronic Packaging & Production*, Jan. 1997, pp. 24–31.

Scientific Sealing Technology, Downey, California, "Hermetic Package Sealing and Assembly Model DAP 2200" brochure, 4pp.

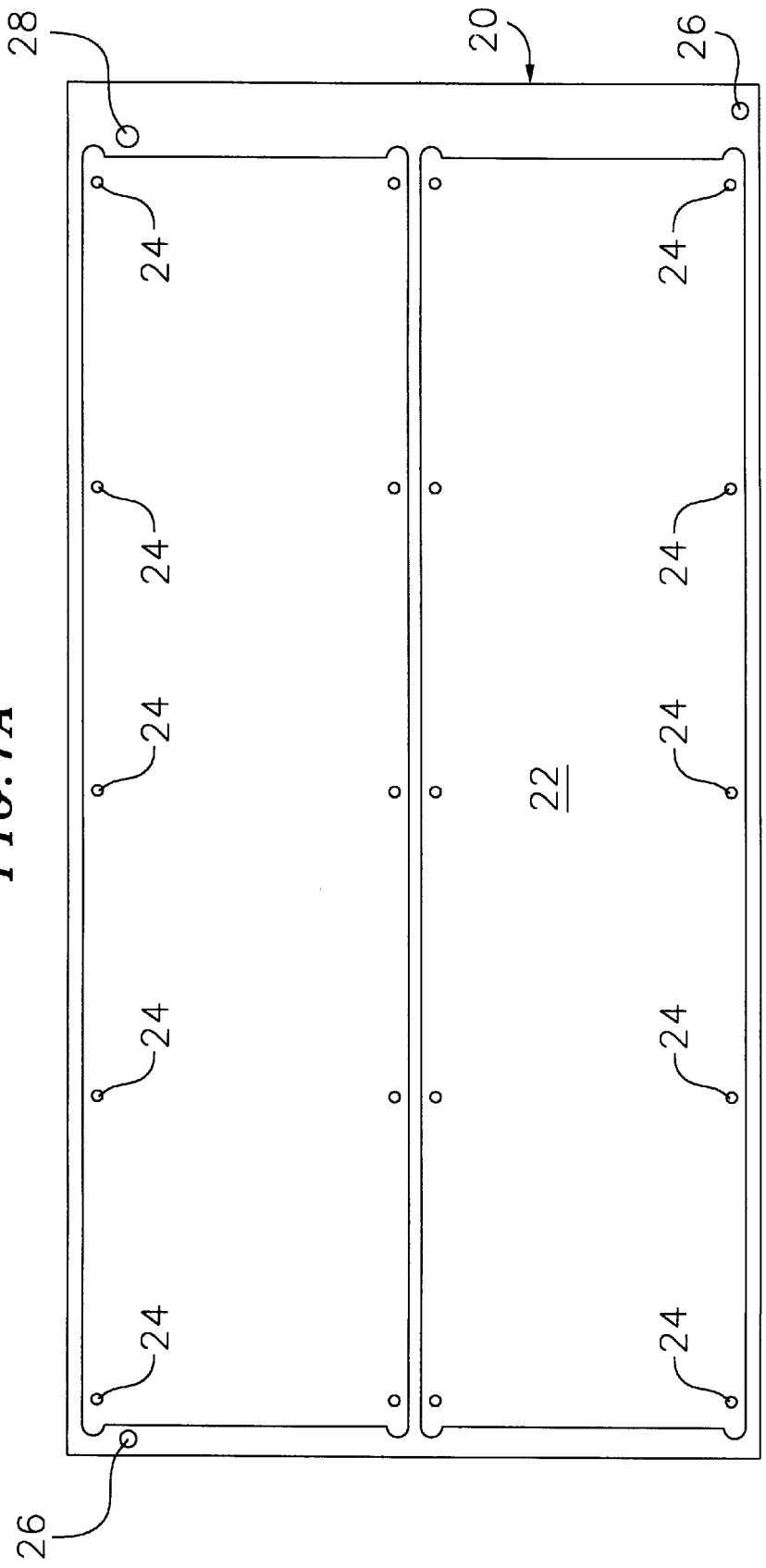
FIG. 1A
FIG. 1B

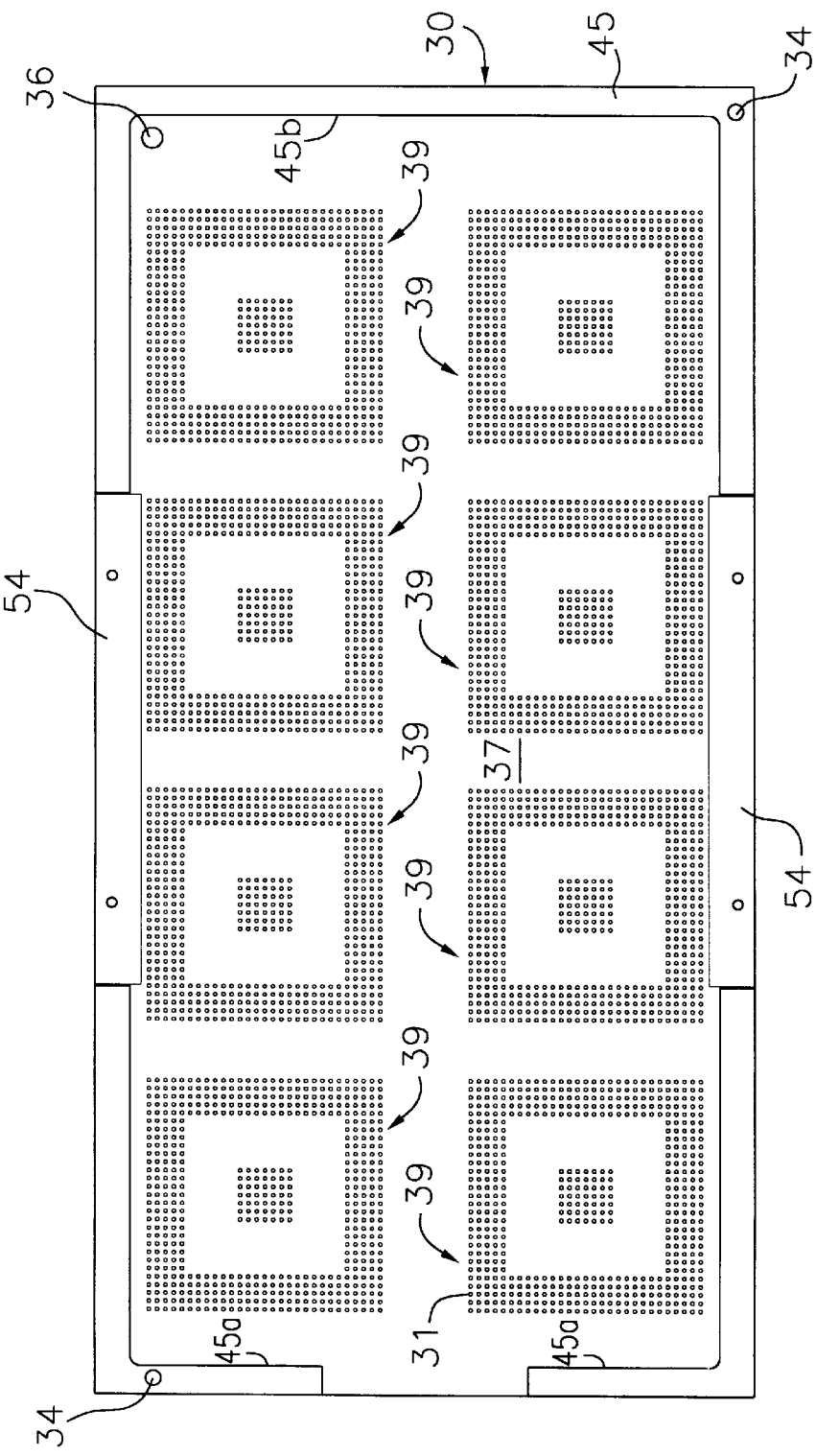
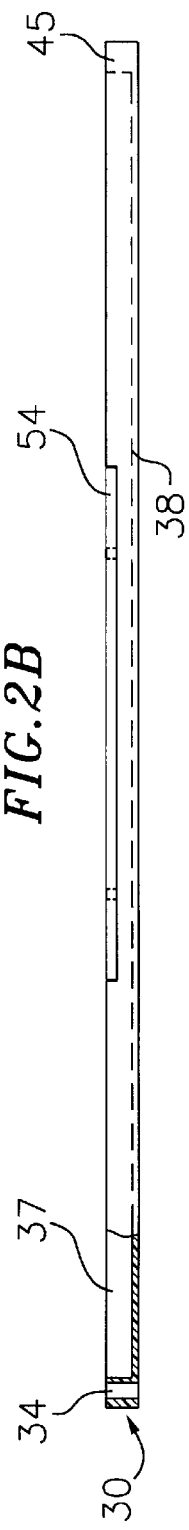
FIG.2A
FIG.2B

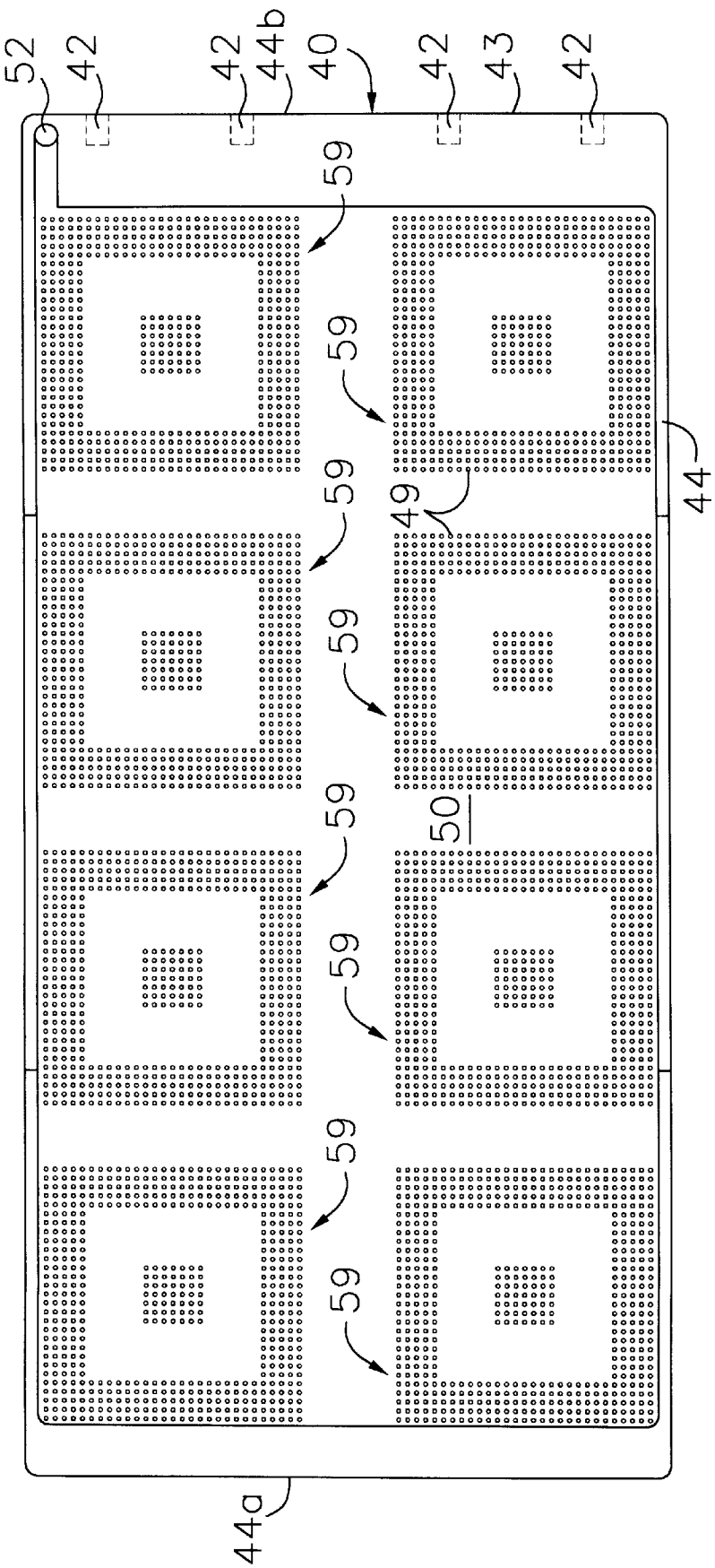
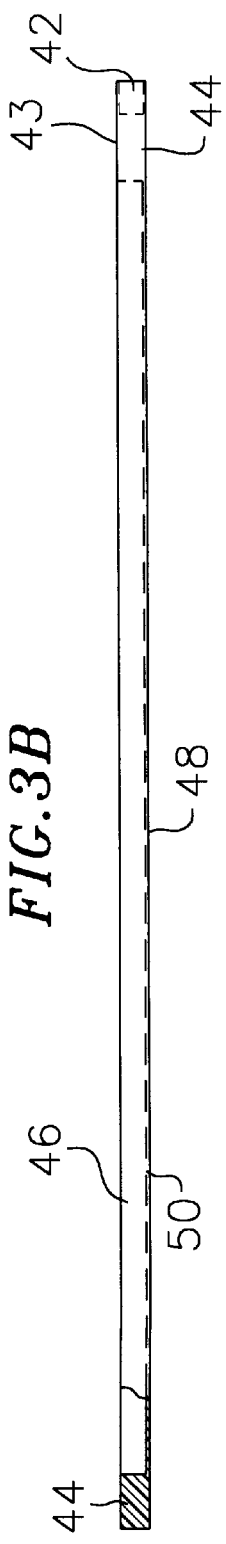
FIG.3A
FIG.3B

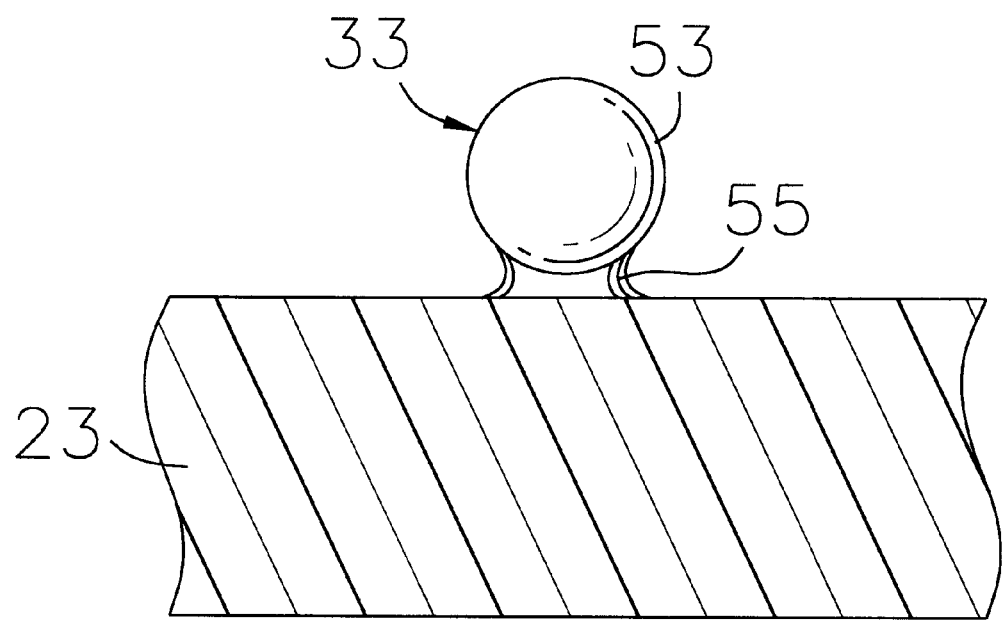

METHOD AND APPARATUS FOR PLACING AND ATTACHING SOLDER BALLS TO SUBSTRATES

CROSS REFERENCE TO RELATED APPLICATIONS

This application claims priority to and incorporates fully herein U.S. application Ser. No. 60/038,097, filed on Feb. 18, 1997; U.S. application Ser. No. 60/071,751, filed on Jan. 16, 1998; and U.S. application Ser. No. 60/073,964, filed on Feb. 6, 1998.

BACKGROUND OF THE INVENTION

This invention relates to a method and apparatus for placing and attaching solder balls to substrates, particularly ball grid array (BGA) packages) without using flux.

Present methods used for attaching solder balls to BGA packages employ flux, a material which prevents the formation of oxides during reflow of the solder balls. In a typical "flux" method, the surfaces of the conductive pads of the substrates are coated, e.g., screened, with flux and the balls are placed into position on the package. As the flux dries, the balls become stuck to the pad surfaces. Occasionally, two balls may stick to a single pad surface or, conversely, no balls may stick to a particular pad surface. The assemblies are placed on a conveyor and the balls are reflow-soldered to the BGA pads in a furnace. As the assemblies heat-up during the reflow process, the flux is liquefied and the flux bonds between the balls and pads are destroyed. As a result, the balls are free to move during the rigors of transport through the furnace. Consequently, defects such as vacancies, bridging of adjacent balls and loss of positional accuracy are created. Also, flux residues are trapped between the pads and the underside surfaces of the balls and is difficult to completely remove. These uncleaned residues may, depending on the type of flux used, cause high resistance shorts and/or corrosion subsequent to final assembly soldering operations. Consequently, the flux residues must be removed which requires a separate cleaning step and apparatus. Moreover, many current cleansers used to remove flux are not environmentally safe. U.S. Pat. Nos. 5,499,487 and 5,551,216, both of which are incorporated herein by reference, disclose conventional methods and devices for the placement of solder balls on BGA packages.

The demand for BGA devices has steadily increased, and more efficient high volume manufacturing assembly methods need to be developed to keep pace. Production yields also need to be improved so that the cost of manufacturing can be reduced. Accordingly, there is a need for a new and more cost effective method of placing and attaching solder balls on BGA packages.

SUMMARY OF THE INVENTION

Applicants have developed a new and improved "fluxless" or "flux-free" method of and apparatus for placing and attaching solder balls in a predetermined pattern to the conductive pads of substrates that eliminate many, if not all of the problems associated with current methods. The new method utilizes specially designed tooling for loading and holding the packages and balls in the required position during processing. The soldering operation is performed without flux in a controlled atmosphere.

The substrate may be any substrate on which solder balls may be attached. Examples of substrates include ceramic and plastic BGA packages, mini and micro BGA packages, flip chips, wafer scale flip chips, micro-electromechanical systems (MEMS) interconnects and the like.

In the method, a substrate, and preferably a plurality of substrates, are loaded into a carrier or holder. An alignment plate comprising a plurality of through-holes is removably fixed in position above the substrate and spaced apart from the substrate a distance less than the diameter of the solder balls. The pattern of the through-holes in the alignment plate corresponds to the pattern of conductive pads of the substrate(s) in the carrier on which the solder balls will be attached. A solder ball is then loaded into each hole of the alignment plate whereby the solder ball drops by gravity into contact with a conductive pad of the substrate(s). The alignment plate maintains the solder balls in contact with the pads.

The carrier and alignment plates are preferably made of graphite but may be made of any other suitable material such as ceramic, aluminum oxide and the like. It is preferred that the alignment plate be made of a material that is not wetted by or adhered to by the melted solder balls.

The solder balls may be made of the same material throughout or may have, for example, a core of a higher melting temperature material and an outer shell of a lower melting temperature material. Both types are commercially available and are well known in the art. For example, suitable solder balls are available from Alpha Metals Inc. of New Jersey and are described in Alpha Metals Inc.'s Technical Bulletins SM-480 through SM-487, and Application Bulletins SM487 through SM490 and SM473-1, all of which are incorporated herein by reference. Any size solder balls may be used. Preferred sizes include diameters of 0.002 inch and up.

Once the solder balls have been loaded into the alignment plate, the alignment plate and carrier are then heated in an inert atmosphere to a temperature sufficient to melt or reflow the surface of the solder balls. The alignment plate and carrier assembly are then cooled to resolidify the material of the solder balls which bond to the conductive pads of the substrate(s). The alignment plate is then disengaged from the carrier and the substrate(s) is (are) removed from the carrier.

The carrier and alignment plate are preferably heated for a time and at a temperature and reduced pressure, e.g., 1 torr to 1 millitorr, and in an appropriate atmosphere, e.g., in the presence of an inert gas such as Nitrogen, sufficient to remove at least a portion of and preferably all of any oxides existing on the surface of the solder balls. Thereafter, the substrate and alignment plate are heated for a time and at a temperature and pressure and in an appropriate atmosphere, e.g., Nitrogen, sufficient to at least partially melt or reflow the solder of the solder balls so that solder flows onto and bonds with the conductive pads of the substrate.

Heating may be accomplished by any suitable method. In a presently preferred method, the alignment plate and carrier are made of graphite. Heating comprises electrically connecting the graphite carrier and alignment plate to electrodes and passing an electrical current through the carrier and alignment plate. Because of the electrical resistance of the graphite, the temperature of the carrier and alignment plate rises rapidly. Rather than heating by electrical resistance, the carrier and alignment plate may be placed, for example, on a hot plate, or in an oven or heated by some other appropriate heating device.

In a particularly preferred embodiment of the invention, BGA packages are placed in a holder or carrier in an up-side-down position, i.e., pads facing up. An alignment plate is positioned over and removably fixed to the carrier.

The alignment plate has a through-hole pattern that corresponds to the pad pattern on the BGA packages. The hole diameter is slightly larger than the ball diameter. Balls are loaded into the holes (one ball per hole). Since the alignment plate is fixed to the carrier, the hole wells prevent the balls from moving. The balls contact the pad surfaces while being precisely fixed in the required position. The alignment plate/carrier assembly is automatically placed on a graphite platen inside a chamber. The chamber lid is closed. The chamber is back filled with an inert gas and an electrical current is passed through the platen. The graphite material serves as a resistance heater and heat is rapidly generated and thermally conducted into the alignment plate/carrier assembly. The chamber load is heated to the soldering temperature whereupon the solder balls melt, forming ball/pad joints or bonds. The time required for soldering (loading of chamber, heat-up period, dwell time, and cool-down period) is typically 10 minutes or less. The soldering operation is accomplished without the use of flux. In this way, post solder cleaning is not required.

The solder balls may be loaded into the holes of the alignment plate by any suitable method or apparatus. One preferred method incorporates a shutter/alignment plate assembly comprising a shutter plate slidably positioned over the alignment plate. The shutter plate comprises a pattern of through-holes corresponding to the through-hole pattern of the alignment plate. The shutter plate is biased, preferably spring-biased, into a first position where the holes of the shutter plate are offset from the holes of the alignment plate. In this position, each of the holes of the shutter is loaded with a solder ball. The shutter is then slid against the spring force to a second position wherein its holes are aligned with the holes of the alignment plate. When aligned, the solder balls fall by gravity through the holes of the alignment plate and into contact with the conductive pads of the substrate(s) which have been loaded into the carrier. The shutter is then released and the spring force biases it back to its original first or offset position. The shutter plate in its first position traps the solder balls within the holes of the alignment plate.

Another method for loading solder balls into the holes of the alignment plate is to provide a vacuum loader plate connected to a vacuum pump. The vacuum loader plate has a plurality of through-holes, each of which is connected to a vacuum pump. The holes are in the same pattern as the holes of the alignment plate. At least a portion of each hole is smaller in diameter than the diameter of the solder balls. Solder balls are loaded into and retained by vacuum created by the vacuum pump in each hole of the vacuum loader plate. In one embodiment, only a portion of each ball extends into each hole. In another embodiment, the holes form an enlarged cup into which part or all of the balls may be received. The vacuum loader plate is then positioned over the alignment plate, the holes of the vacuum loader plate being aligned with the holes of the alignment plate. The vacuum is then discontinued and the solder balls fall by gravity into the holes of the alignment plate and drop down into contact with the substrate.

If desired, the vacuum loader plate assembly and alignment plate can be combined into a single structure. In such an embodiment, the holes on the side of the vacuum loader/alignment plate in which the solder balls are loaded are enlarged to a diameter slightly larger than the diameter of the solder balls to form cups for receiving the solder balls. After the vacuum loader/alignment plate is loaded, a vacuum is established to maintain the balls in the cups and the vacuum plate is positioned over the carrier such that the holes of the vacuum loader/alignment plate are aligned with the conductive pads of the substrate(s) loaded into the carrier. The vacuum which has maintained the solder balls in the "cups" is then released and the balls fall into contact with the conductive pads of the substrate(s). Thereafter, the vacuum loader/alignment plate and carrier are heated and cooled to bond the solder balls to the substrate. In such an embodiment, the vacuum loader/alignment plate is preferably made of graphite.

In yet another embodiment of the invention, the holes in the alignment plate are blind holes rather than through-holes. The alignment plate is positioned with the holes facing up and the solder balls are loaded into the alignment plate holes by any other suitable, manual or automatic method. The carrier plate with the BGA packages is then mated on top of the alignment plate. The entire assembly is then flipped upside down so as to cause the solder balls to fall by gravity into contact the pads of the substrates. The assembly is then heated.

BRIEF DESCRIPTION OF THE DRAWINGS

FIG. 1A is a top view of a typical carrier plate.

FIG. 1B is a partial cross-sectional view of the carrier plate shown in FIG. 1A.

FIG. 2A is a top view of a typical alignment plate.

FIG. 2B is a partial cross-sectional view of the alignment plate shown in FIG. 2A.

FIG. 3A is a top view of a typical shutter plate.

FIG. 3B is a partial cross-sectional view of the shutter plate shown in FIG. 3A.

FIG. 6 is a side view of a solder ball interconnect (solder bump) formed by the present invention.

DESCRIPTION OF THE PREFERRED EMBODIMENTS

Figure 4:
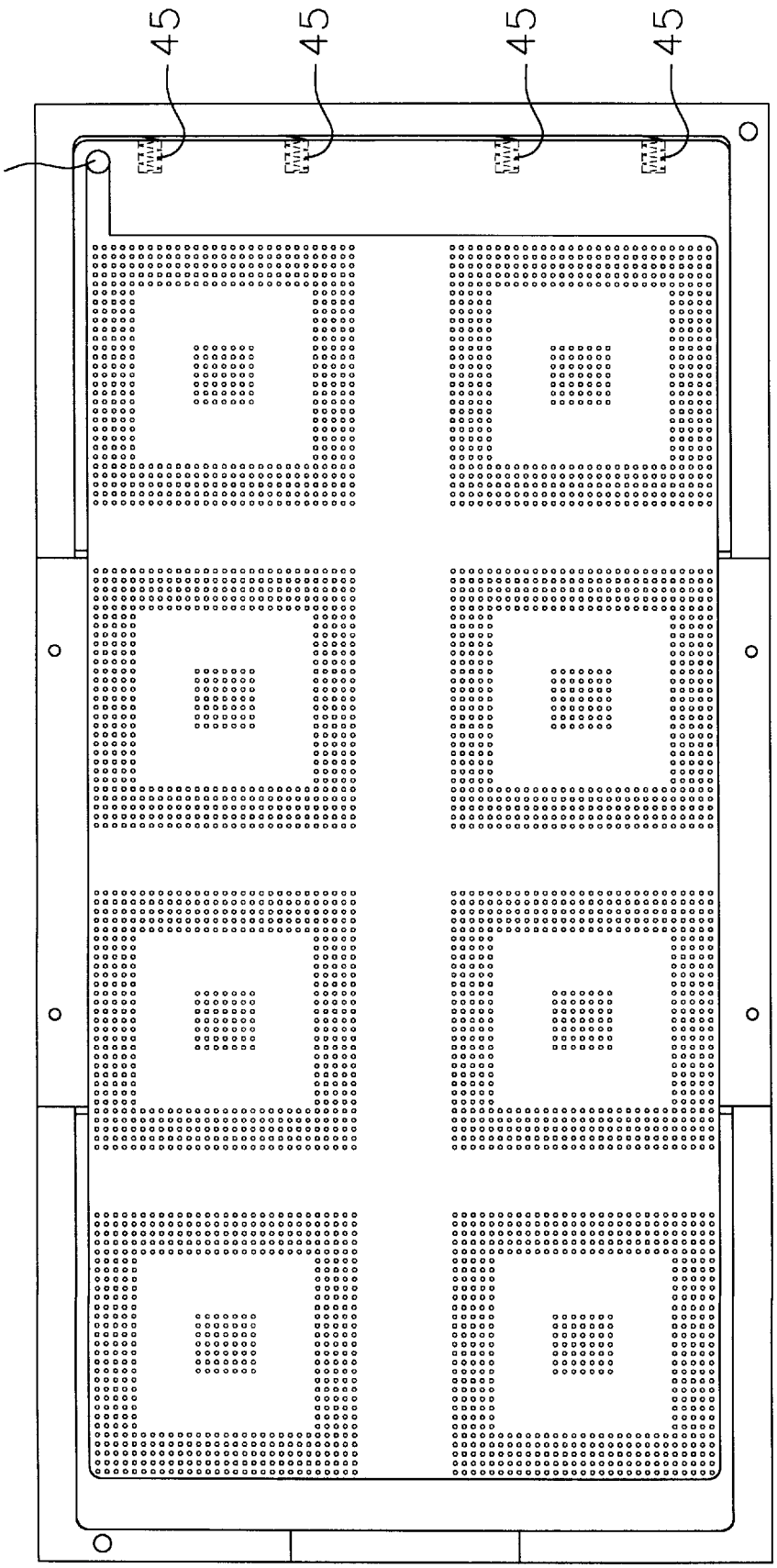
FIG. 4 is a top view of the carrier plate, alignment plate and shutter plate assembly.

In accordance with the method of the present invention, solder ball attachment is performed in a controlled atmosphere furnace, such as the MV-2200 furnace commercially available from Scientific Sealing Technology, a division of EDM Supplies, Inc., of Downey, Calif. The MV-2200 furnace is described in the brochure entitled "Enhanced Vacuum Process Furnace Model MV-2200" from Scientific Sealing Technology and incorporated herein by reference.

The apparatus or tooling for the solder ball attachment is composed of two plates, a carrier 20 and an alignment plate 30, machined preferably from graphite material. The carrier 20 (also referred to as the boat, holding plate, locating plate or holder) is specially machined with cavities 22 to accept the BGA packages or other suitable substrates (FIGS. 1A and 1B). The cavity depth is slightly greater than that of the substrate thickness. While the present invention is being described herein in terms of BGA packages having pads, this invention may be used to place and attach balls on other substrates such as mini and micro BGA packages, flip chips, wafer scale flip chips, micro-electromechanical systems (MEMS) interconnects and the like having metalized pads or vias or other suitable features. Thus, use of the term "BGA packages" herein should be construed to include all other types of suitable substrates.

The carrier 20 in FIGS. 1A and 1B includes two cavities 22 for holding eight BGA packages. This is an exemplary carrier plate. However, other carriers may be used that can hold only one or a large number of BGA packages. The carrier may have a separate cavity for each BGA package. For illustrative purposes, however, the present invention is described in reference to the carrier shown in FIGS. 1A and 1B. Each cavity 22 includes dowel pins 24 for locating the BGA packages. The carrier 20 also includes a drain 28 and two locating pins 26.

The top plate or alignment plate 30 (FIGS. 2A and 2B) of the furnace consists of drilled through-holes in a pattern 39 that corresponds exactly to the specific pad patterns of the BGA packages loaded into the carrier 20. The alignment plate has a "bathtub" well 37 on its upper side which is surrounded by a peripheral edge 45 (FIG. 2B). The hole patterns 39 are drilled through the base 38 of the well 37 to correspond to each BGA package placed in the carrier 20. The holes 31 making up the hole pattern 39 are slightly larger in diameter than the solder balls (See FIG. 5B). For example, if the solder balls 33 are 0.010 inch in diameter, the holes are preferably about 0.011 inch in diameter. A chamfered surface 32 (FIGS. 5A, 5B and 5C) is provided at the top and bottom of the holes. The top chamfered surface is provided to make it easier to load solder balls into the holes. The bottom chamfered surface is provided to allow movement of the solder balls in contact with the conductive pads as discussed below. The thickness of the alignment plate at the base 38 of the well 37 is typically about two times the solder ball diameter. The alignment plate also includes openings 34 on its peripheral edge 45 to accommodate the locating pins 26 of the carrier 20 and a drain 36.

Figure 5A:
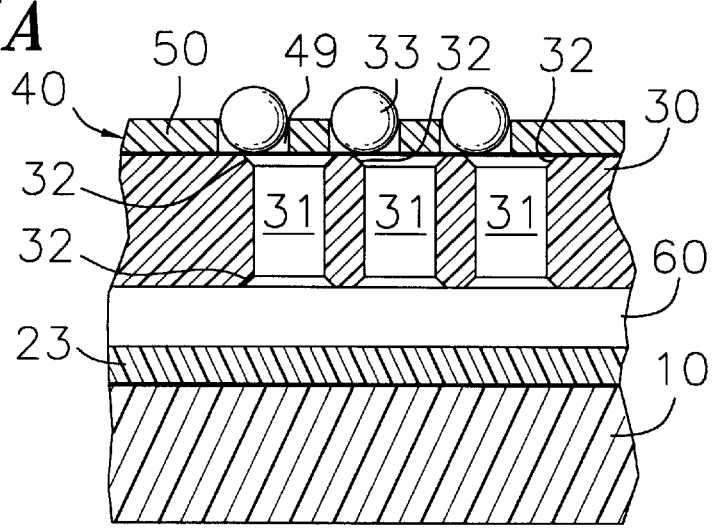
FIG. 5A is a partial cross-sectional view of the assembly in the solder ball loading position.
Figure 5B:
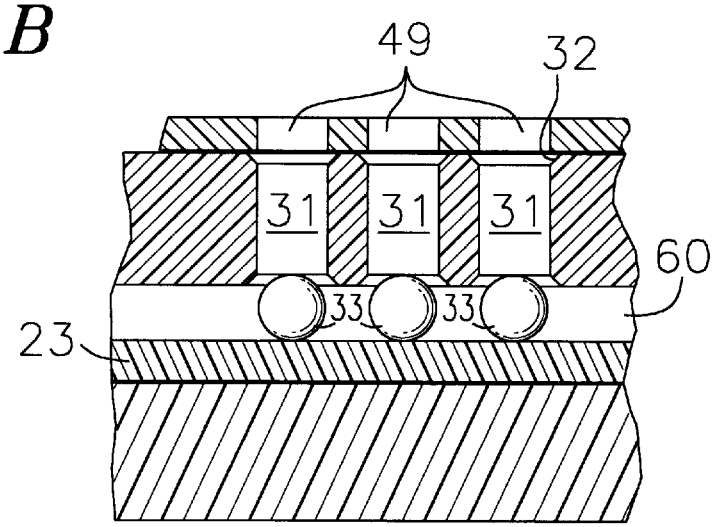
FIG. 5B is a partial cross-sectional view of the assembly in the solder ball drop position.
Figure 5C:
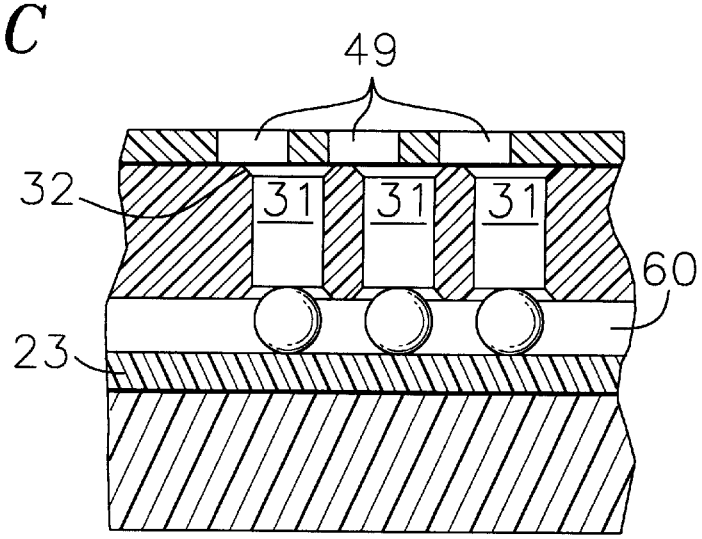
FIG. 5C is a partial cross-sectional view of the assembly in the soldering position.

The cavities are loaded with BGA packages 23 which are properly aligned via the dowel pins 24. The alignment plate 30 is then mated with the carrier such that locating pins 26 fit into openings 34 of the alignment plate 30, aligning the two plates. The drain 28 of the holding plate is aligned with the drain 36 of the alignment plate. A gap 60 exists between the BGA package and the alignment plate (FIGS. 5A, 5B and 5C). The gap may be controlled by the length of the locating pins 26 if the openings 34 are blind holes, i.e., do not penetrate through the entire thickness of the peripheral edge. Alternatively the cavities 22 of the carrier may be of a preselected depth to provide a desired gap between the BGA packages and the alignment plate 30, when the alignment plate 30 is mated against the peripheral edge of the carrier 20. It is understood that any suitable means for providing the desired gap may be used. For example, if the holding pins 24 are tapered toward their free end, the gap may be controlled by the diameter of the openings 34.

Figure 7:
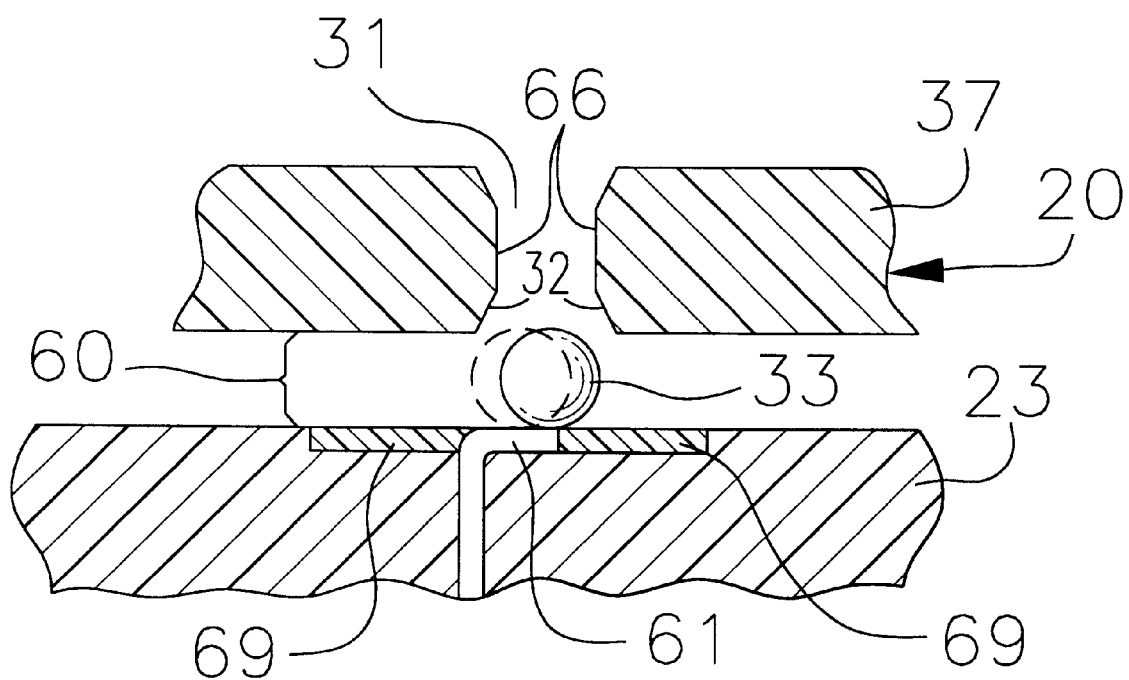
FIG. 7 is a partial cross-sectional view of the assembly shown in FIG. 4 depicting the gap between the alignment plate and a BGA package.

The gap 60 between the alignment plate and the BGA packages allows for centering of the balls over the pads 61 on the BGA package 23 (FIG. 7). When the solder balls are within the holes 31 of the alignment plate 30 they can not move much since preferably the diameter of the holes 31 is not more than 0.001 inch greater than the diameter of the solder balls. When the solder balls rest against the pads on the BGA packages a major portion of the balls are within the gap 60 which is less than the diameter of the solder ball and preferably about 75% of the solder ball diameter. That is, if the diameter of the solder balls is 0.005 inch, the spacing between the carrier and the alignment plate is preferably from about 0.003 to about 0.004 inch. As a result, only the lesser diameter upper portions of the balls are constrained within the increased diameter chamfered edges 32 of the walls 66 of the holes 31 on the alignment plate. Thus, the solder balls are allowed to move a distance greater than the typical 0.001 inch spacing between the hole walls and the balls. This available movement allows the balls to center themselves on the pad by moving to the position depicted by the dashed lines on FIG. 7. This movement is caused by the surface tension imposed by the pads on the melting solder balls. Typically, a solder resist portion 69 surrounds the pad. The solder resist portion provides no surface tension to the melting solder balls. Consequently, the melting outer surface of the solder balls causes the solder balls to center over the pads which provide a surface tension. This "self automated" centering of the balls on the pads is important because it allows for less than perfect matching between the hole pattern the alignment plate and the pads on the packages. Moreover, it allows for thermal expansion mismatches between the alignment plate and the BGA packages.

A generally rectangular shutter plate 40 (also referred to herein as a "shutter") shown in FIGS. 3A and 3B, preferably also machined from graphite is slidably fitted within the well 37 of the alignment plate 30. The width of the shutter plate 40 is about the width of the well 37 of the alignment plate 30. The length of the shutter plate 40 is less than the length of the well 37 of the alignment plate 30, preferably by an amount equal to about half the diameter of a solder ball. In this manner, the shutter plate 40 is afforded lengthwise slidable movement only between a first position wherein the end surface 44a of the shutter plate engages the end wall 45a which forms the well 37 of the alignment plate and a second position wherein the end surface 44b of the shutter plate engages the opposite end wall 45b which forms the well 37 of the alignment plate 30.

The shutter plate has a "bathtub" well 46 on its upper side for receiving and containing solder balls. A peripheral edge 44 of the shutter plate forms the walls of the well 46. The bottom side 48 of the shutter plate 40 is flat. The shutter plate 40 has hole patterns 59 in the base 50 of the well 46 which correspond to hole patterns 39 on the alignment plate. The holes 49 of hole patterns 59 are slightly larger in diameter than the diameter of the solder balls and are typically of the same diameter as the holes 31 in the alignment plate. The base 50 of the shutter plate well has a thickness less than, e.g., about half and preferably about 80% of the solder ball diameter. An edge 43 of the shutter plate has blind, transverse holes 42. The holes 42 receive springs 47 (FIG. 4). The shutter plate also has a drain 52. Once the shutter is fitted over the alignment plate, two retainer plates 54 are mounted on two opposite edges of the alignment plate to hold the shutter plate 40 against the alignment plate 30 without impeding the shutter's slidable movement (FIG. 2A).

When the shutter plate 40 is in position in the well 37 of the alignment plate 30, the springs 47 engage the end wall 45*b* of the alignment plate 30 biasing the shutter plate 40 towards its first position wherein the holes 49 and hole patterns 59 are offset from the corresponding alignment plate holes 31 and hole patterns 39, preferably by about half a solder ball diameter, as shown in FIG. 5A. In this first position, the drain openings 28, 36 and 52 of the holding plate, alignment plate and shutter, respectively, are aligned (FIG. 4). A drain pin (not shown) may be used to plug the aligned drains. Solder balls are then loaded into the well of the shutter plate 40 (FIG. 5A). Loading may be by any suitable means. For example, a quantity of solder balls are simply poured into the well. The assembly, consisting of the carrier 20, BGA packages, alignment plate and shutter (shown in FIG. 4) is then tilted and rolled back and forth so as to cause the solder balls to fill all of the holes 49 on the shutter plate. Only one ball can fit within each hole 49. Because of the contrast between the typically black graphite shutter plate and the silver solder balls, a hole not filled with a solder ball is highly visible. To aid in the visibility of unfilled holes, it is preferable that the shutter plate be of a darker color. Once each hole is filled with a solder ball, the drain pin, if installed, is removed and the assembly is tilted toward the drains causing the remainder of the solder balls to fall by gravity through the aligned drains. Preferably, however, the assembly is kept tilted positioning the aligned drain holes at a low point. Solder balls are then poured into the shutter plate well from the highest wall of the well. The poured balls fill the holes or travel down the well and exit through the drains. Ball are poured continuously until all of the shutter plate holes 49 are filled.

It is apparent that tilting may not be required to remove the excess balls from the shutter panel prior to alignment of the panel with alignment panel. For example, a shutter plate having a thickness at the base or its well approximately equal to the diameter of the solder balls may be used. In this regard, the balls filling the holes on the shutter plate will not extend beyond the upper surface of the shutter plate. The excess balls may then be swept, automatically or manually to the drain. For example, another plate may be passed across top of the shutter base for the purpose of sweeping excess solder balls to the drain or otherwise segregating the excess balls from the shutter plate.

Once excess solder balls are removed from the well 46, the shutter plate is then slid against the spring force until it stops in its second position against the edge 45*a* of the alignment plate 30. In this position, the shutter holes 49 are aligned with the holes 31 of the alignment plate (FIG. 5B). When this occurs, the solder balls drop into the holes of the alignment plate and come to rest against the pads on the BGA packages. Any solder ball not falling into its corresponding alignment plate hole is highly visible and easily recognized. Tapping may be required to assist any solder ball which does not immediately drop into the holes 31 in the alignment plate. Once all the balls drop into the holes of the alignment plate the shutter plate is released and the springs 47 cause to the shutter plate to slide back to its first position where the shutter plate holes 49 are offset from the holes 31 of the alignment plate (FIG. 5C). In its offset position, the shutter plate traps the solder balls in the alignment plate holes 31 and prevents them from escaping while the assembly is placed into a furnace or otherwise heated.

As is apparent to one skilled in the art, the alignment plate with the shutter does not have to be positioned over the carrier until after the solder balls are loaded into the shutter holes. It is also apparent to those of ordinary skill in the art that rather than manually loading the solder balls into the shutter holes, the solder balls may be automatically loaded, for example, by vacuum loading as described below or any other suitable method.

In an alternate embodiment, the solder balls are loaded on the alignment plate using vacuum loader which includes a vacuum pump, a vacuum loader plate and suitably vacuum lines between the vacuum pump and vacuum loader plate. With this embodiment, the alignment plate does not need to have a well. A constant thickness alignment plate may be used.

Figure 8A:
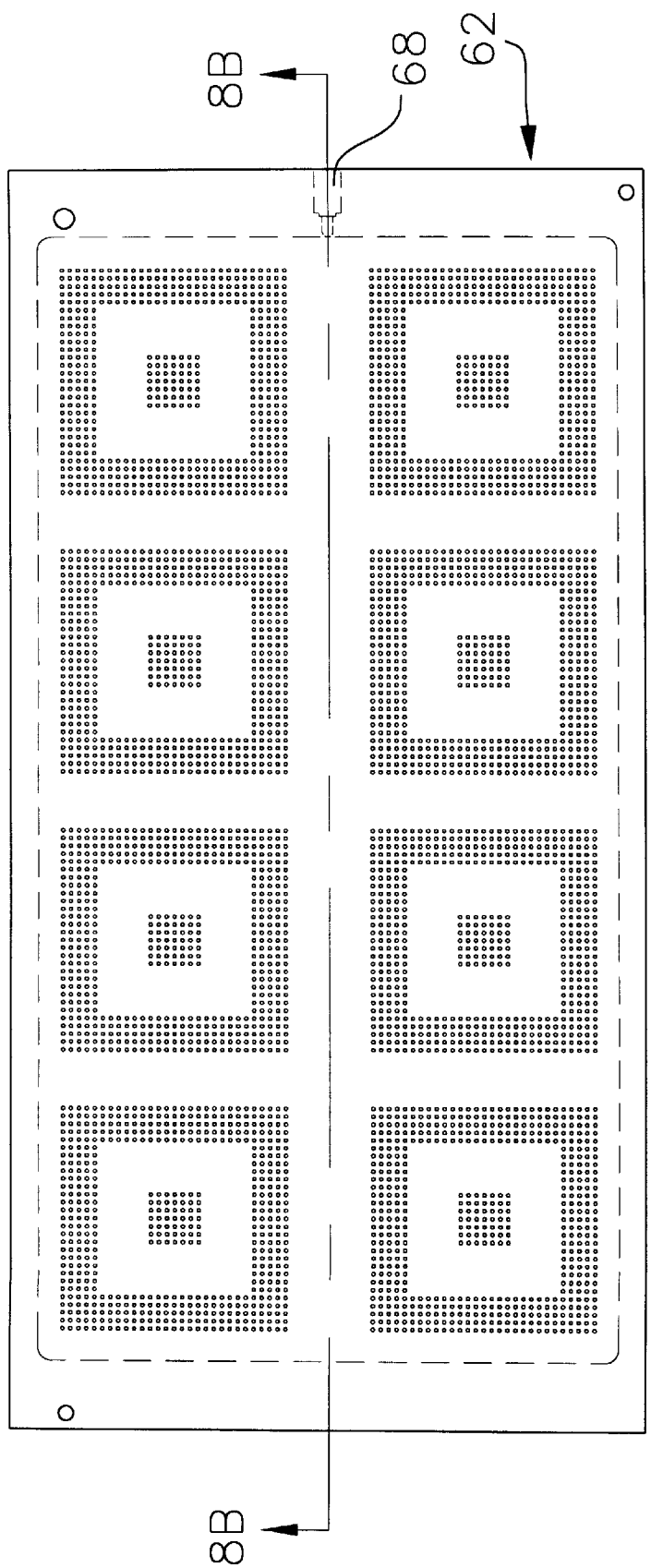
FIG. 8A is a top view of a typical vacuum loader plate designed for the hole pattern shown in FIG. 2A.
Figure 8B:
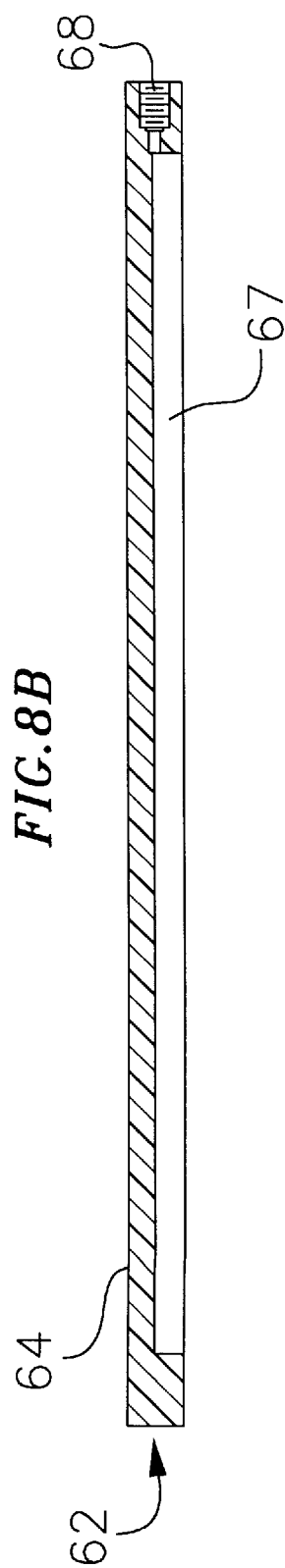
FIG. 8B is a cross-sectional view of the loader plate shown in FIG. 8A.
Figure 8C:
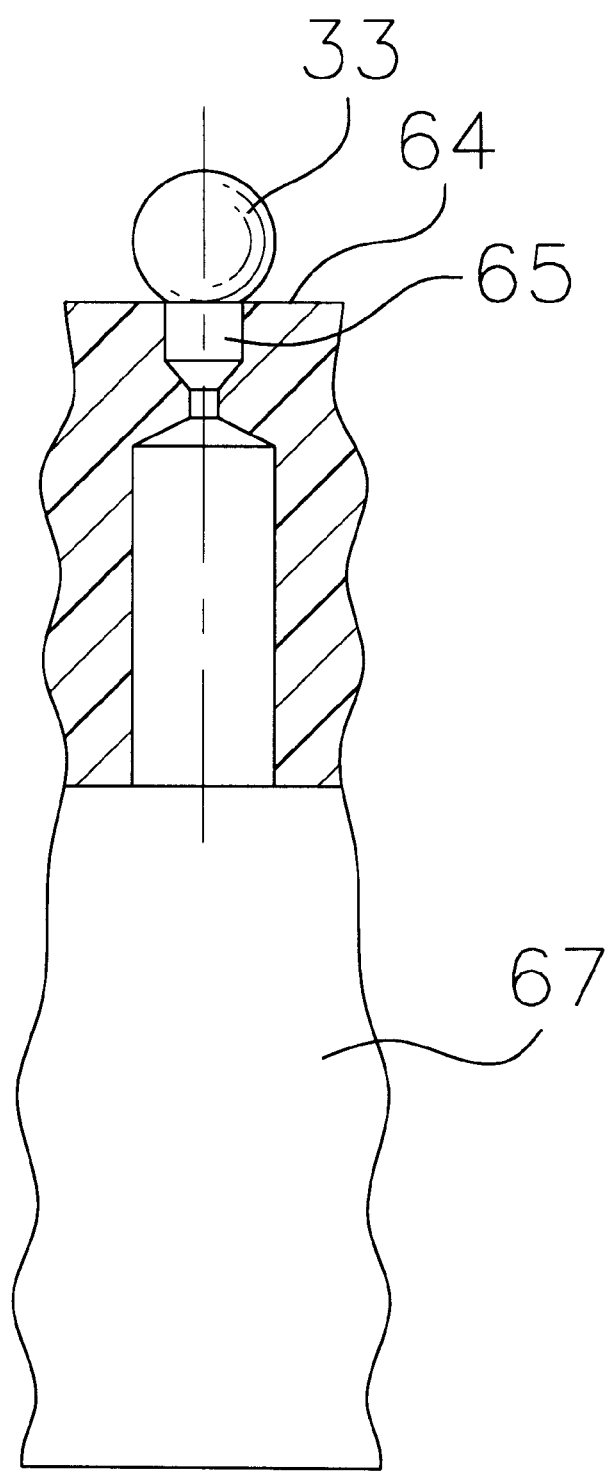
FIG. 8C is a partial cross-sectional view of the vacuum loader plate shown in FIG. 8A depicting the geometry of a typical hole on the vacuum loader plate.
Figure 9A:
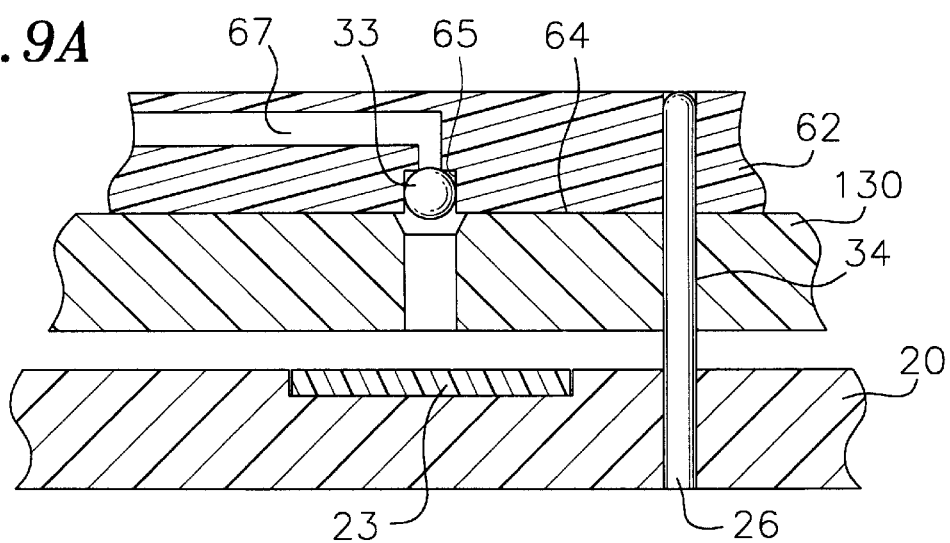
FIG. 9A is a partial cross-sectional view of a vacuum loader plate, alignment plate, BGA package and carrier plate assembly depicting an alternate embodiment vacuum loader plate.

With reference to FIGS. 8A and 8B the vacuum loader plate 62 detail has the same corresponding hole pattern as does the alignment plate 30. However, the cross sectional geometry of the vacuum loader plate holes is not the same as the cross-sectional geometry of alignment plate holes (FIG. 9A). The solder balls are held by vacuum against openings or holes 65 on the outer surface 64 of the vacuum loader plate. The vacuum loader plate is used to deliver the balls held by vacuum in a predetermined pattern to the alignment plate. The holes 65 have a diameter smaller than the ball diameter so that the balls do not pass through the holes and into the vacuum lines (not shown). Preferably, a portion of the holes 65 adjacent the surface 64 of the loader plate is enlarged to form a cup having a diameter slightly larger than the diameter of the solder balls, but a depth slightly less than the diameter of the solder balls. In such an embodiment, the solder balls, when loaded in the holes will protrude slightly from the outer surface 64 of the loader plate as shown in FIG. 9A.

Figure 9B:
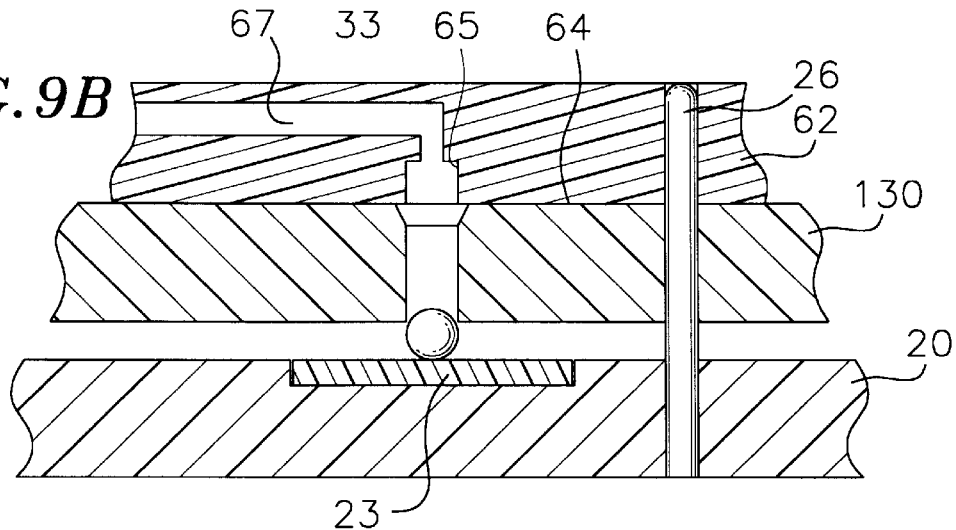
FIG. 9B is a partial cross-sectional view of an alignment plate mated to a carrier plate with a solder ball in position for attachment to the BGA package.

In the embodiment shown, a cavity or plenum 67 (FIG. 8B) is formed in the vacuum loader plate 62 in communication with vacuum into which is vacuum port 68, which, in turn, is connected to a vacuum pump (not shown). When a vacuum is generated, i.e., pressure is reduced in the cavity 67 of the vacuum loader plate 62, and the vacuum loader plate is positioned on or in a bed of solder balls, solder balls are drawn into the holes of the plate. Excess balls can be brushed off. The loaded vacuum loader plate is then joined to the alignment plate 130 by way of the locating pins 26 extending through the holes 34 on the alignment plate or by way of separate dowel pins (not shown) protruding beyond the upper surface of the alignment plate (FIG. 9A). When mated with the alignment plate, the hole patterns of the vacuum loader plate 62 are aligned with the hole patterns of the alignment plate 30. The vacuum is released and the balls fall by gravity into the alignment plate holes. If desired, the loader can be backfilled with gas to a pressure sufficient to urge the solder balls away from the loader plate into the holes of the alignment plate. As a result, the balls are precisely located on the BGA pads and are restrained by the walls of the alignment plate holes (FIG. 9B).

Figure 10:
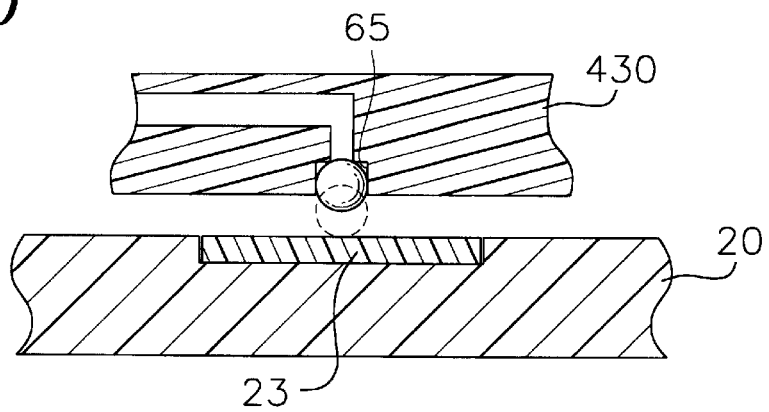
FIG. 10 is a partial cross-sectional view of an alternate embodiment assembly where the vacuum loader plate is also an alignment plate.

In an alternate embodiment, the vacuum loader plate can also be the alignment plate as shown for example in FIG 10.

The vacuum loader/alignment plate 430 is used to pick up the solder balls as described above. The vacuum loader/alignment plate is then mated to the carrier so that its openings 65 are aligned with the pad pattern on the BGA package and a gap between the carrier and the vacuum loader/alignment plate is provided as described above. The vacuum is the released and the solder balls 33 drop and contact the appropriate pads, as shown by the dashed lines in FIG. 10.

Figure 11A:
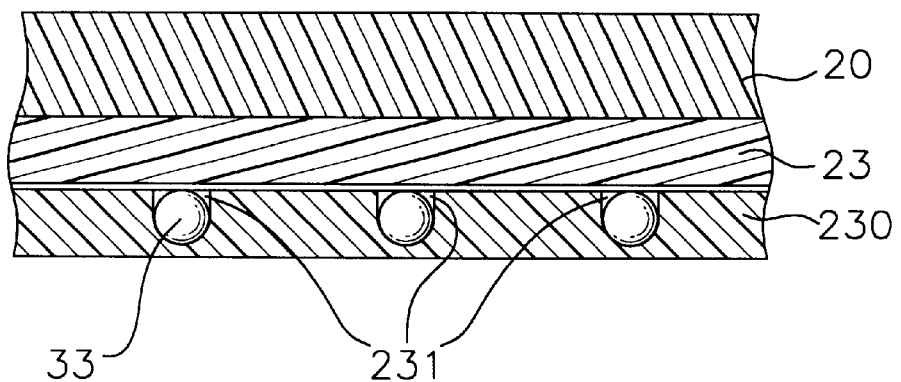
FIG. 11A is a partial cross-sectional view of an alternate embodiment assembly consisting of carrier plate, a BGA package and an alignment plate with blind holes.

In a further embodiment of the invention shown in FIG. 11A the alignment plate 230 comprises blind holes rather than through-holes. For example, the holes 231 may extend part way through the thickness of the alignment plate 230 and preferably at least to a solder ball diameter thickness. The solder balls are then loaded on the alignment plate using the shutter plate approach, the vacuum plate approach, manually or automatically. The carrier plate 20 with the BGA packages 23 is then mated on top of the alignment plate using the locating pins. The two plates are firmly held together. The entire assembly is then flipped upside down so as to cause the solder balls to fall into contact with the pads due to gravity. The assembly may then be placed in the furnace.

Figure 11B:
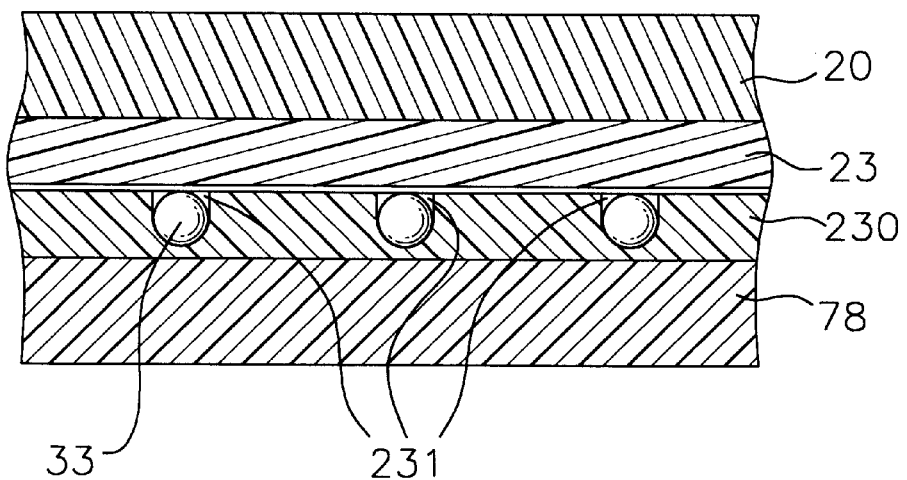
FIG. 11B is a partial cross-sectional view of an alternate embodiment assembly consisting of carrier plate, a BGA package, an alignment plate with blind holes and a top plate.

To minimize shifting between the alignment plate and the BGA packages, an alignment plate having a coefficient of thermal expansion similar to that of the BGA packages is preferred. A minimum shifting is especially desirable in the case where small diameter solder balls are used (e.g., a diameter of about 0.005 inch). When small diameter balls are used, the slightest shifting may cause misalignment of the balls from the pads. In many cases it may not be feasible to have an alignment plate that has the appropriate coefficient of thermal expansion and which is capable of generating or conducting heat. In such cases, it is preferable to use a furnace top plate 78 that is separate from the alignment plate 230 as shown in FIG. 11B. For example, when placing and attaching solder balls on a silicon wafer 333, it preferred that a silicon alignment plate 330 is used. A separate furnace top plate 78 is then mated over the alignment plate.

Figure 12:
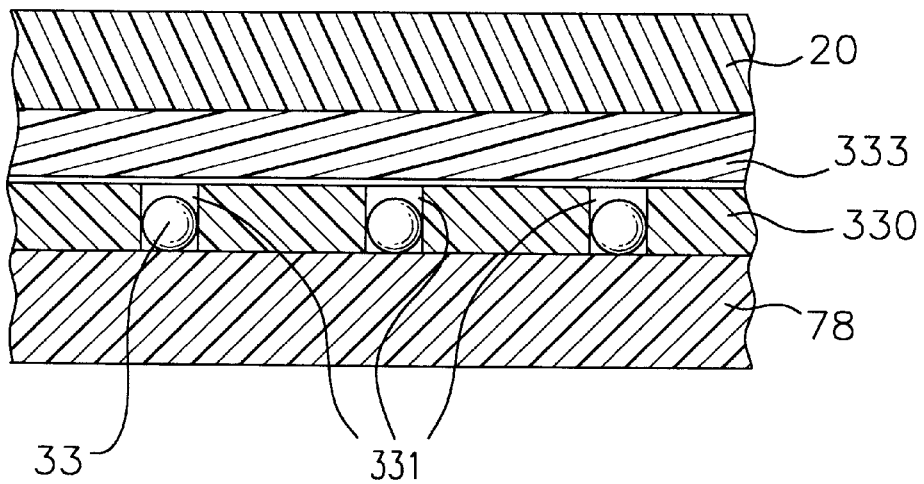
FIG. 12 is a partial cross-sectional view of an alternate embodiment assembly consisting of carrier plate, a BGA package, an alignment plate with through holes and a top plate.

As is apparent to one skilled in the art, in any of the above described embodiments, the alignment plate does not have to be the top plate in the furnace. With any of these embodiments, a furnace top plate may be used that mates to the alignment plate. Moreover, in the embodiment where the alignment plate has blind holes, the same function may be obtained by providing the alignment plate with through-holes 331 and also providing a top plate 78 which serves to hold the solder balls in the alignment plate during the loading process (FIG. 12).

Once the solder balls are in position on the pads of the BGA packages, the entire assembly is connected to electrodes or placed on heating elements inside the chamber of the furnace. A suitable furnace profile is programmed into the memory of the furnace microprocessor. The lid of the chamber is closed and the air withdrawn preferably to a pressure in the range of about 1 torr to 1 millitorr. The chamber is then backfilled with Nitrogen or other inert gas to a pressure of about 10 psig, but preferably to a pressure of about 1 to 4 psig. The chamber is again evacuated to a pressure of from about 1 torr to about 1 millitorr and an electrical current is passed through the tooling, i.e., the carrier and alignment plates. In the case where the plates are connected to the furnace electrodes, the plates are rapidly heated since the graphite material of the carrier and alignment plates is a poor electrical conductor. In the case where the plate are placed on heating elements, the heating elements get heated and the graphite plates are used to transfer the heat to the solder balls and BGA packages.

A preferred furnace profile for 63Sn/37Pb or 62Sn/36Pb/2Ag solder balls is given in Table 1 below. GAS 2 and GAS 3 referred to in Table 1 are inert gases and preferably Nitrogen.

TABLE 1

Preferred Furnace Soldering Profile for 63Sn/37Pb or 62Sn/36Pb/2Ag Solder Balls

| TIME | | | ACTION |
| --- | --- | --- | --- |
| HR 0 | MIN 0 | SEC 1 | VAC ON |
| HR 0 | MIN 0 | SEC 40 | VAC OFF |
| HR 0 | MIN 0 | SEC 42 | GAS 2 ON |
| HR 0 | MIN 0 | SEC 50 | GAS 2 OFF (To −10 psig) |
| HR 0 | MIN 0 | SEC 52 | EXHAUST ON |
| HR 0 | MIN 0 | SEC 56 | EXHAUST OFF |
| HR 0 | MIN 0 | SEC 58 | VACUUM ON |
| HR 0 | MIN 1 | SEC 0 | HEAT ON |
| HR 0 | MIN 1 | SEC 30 | 170° C. |
| HR 0 | MIN 4 | SEC 30 | 170° C. |
| HR 0 | MIN 4 | SEC 32 | VACUUM OFF |
| HR 0 | MIN 4 | SEC 34 | GAS 2 ON |
| HR 0 | MIN 4 | SEC 38 | GAS 2 OFF (To 1–4 psig) |
| HR 0 | MIN 5 | SEC 0 | 225°–325° C. |
| HR 0 | MIN 7 | SEC 0 | 225°–325° C. |
| HR 0 | MIN 7 | SEC 1 | HEAT OFF |
| HR 0 | MIN 7 | SEC 30 | EXHAUST ON |
| HR 0 | MIN 7 | SEC 34 | GAS 3 ON |
| HR 0 | MIN 7 | SEC 58 | GAS 3 OFF |
| HR 0 | MIN 8 | SEC 0 | EXHAUST OFF |

Typically, the temperature is raised to 170° C. and maintained 3 minutes in a vacuum atmosphere which helps to remove oxides on the surface of the solder balls. The chamber may also be purged and filled preferably with Nitrogen a few times prior and/or while the temperature is being raised to about 170° C. to create an inert environment in the chamber. Thereafter, the chamber is filled with Nitrogen to a pressure of about 1 to 4 psig and the temperature is raised to about 225°–325° C. and held for about two minutes. This is sufficient for the solder balls to melt and flow on the pads. Upon cooling, the solder balls 33 are bonded to the BGA packages 23 in the omega shape shown in FIG. 6. Thereafter, the assembly is removed from the chamber and the parts removed from the tooling. Since the soldering process is a fluxless operation and since the solder balls contain no flux, post reflow cleaning is not required. It is understood that any suitable furnace profile can be used as would be apparent to those of ordinary skill in the art.

By using the method of the present invention, solder ball interconnects (solder bumps) are formed on the substrate which have substantially improved coplanarity, i.e., uniformity in height, and improved accuracy in pitch, i.e., spacing. Preferably the variance in coplanarity among the solder ball interconnects is less than 10%, more preferably less than 5%, of the average height of the solder ball interconnects. The solder ball interconnects which are formed have a unique omega shape, with a generally spherical head region 53 and a curved or radiused neck region 55 adjacent the surface of the substrate, the minimum and maximum diameter of the neck region being smaller than the largest diameter of the head region generally as shown in FIG. 6.

As is apparent to one skilled in the art, the entire process described above may be automated or may be practiced manually. Automation may occur through use of robots. Electronic means may be used to ascertain whether each hole on the shutter plate is filled with a solder ball.

The furnaces described above typically can accommodate more than one tooling set (i.e., alignment plate and a carrier plate). As such, the present invention can be used to place and attach solder balls on multiple substrates on multiple carrier plates simultaneously.

In fact, the present process is capable of high volume production and extremely high yields. As an example, 3,300 chip scale BGA's can be processed per load. This equates to approximately 19,800 parts per hour. The process will accommodate any package size and ball diameters of 0.005–0.035 inches. Since the parts, including the solder balls and pads, are fixed during processing, vacancies, bridging and positional defects are totally avoided. Defects associated with flux, such as voids, are also totally avoided since the process is a fluxless operation.

The graphite tooling can be designed so that it can be used for multiple operations. Supplemental pieces may be added as required to satisfy the specific objectives of a given operation, but the same basic tooling can be used for all soldering operations. In this way, tooling cost is minimized. Moreover, the cost of assembly is significantly reduced since valuable time is not wasted transferring parts from one piece of specialized single-purpose tooling to another.

As it would become apparent to one skilled in the art, with the present invention, the balls are precisely located in the required position, and the solder joints are free of the defects that are commonly associated with the current method (i.e., vacancies, bridging of adjacent balls, loss of positional accuracy, voids, etc.). As a result, production yields are greatly improved. Since all soldering operations are performed without flux, post solder cleaning is not required.

What is claimed is:

1. A method for attaching solder balls to a substrate in a predetermined pattern defined on the substrate comprising the steps of:

providing an alignment plate comprising a plurality of through-holes in a pattern which corresponds to the predetermined pattern, said through-holes having a diameter slightly larger than the diameter of the solder balls;

placing the alignment plate over the substrate so that the through-holes of the alignment plate are aligned with the predetermined pattern on the substrate;

loading a solder ball into each hole of the alignment plate whereby each solder ball falls into contact at a location defining the predetermined pattern on the substrate;

heating the solder balls in a vacuum to a temperature sufficient to reduce oxides;

heating the solder balls in an inert atmosphere to a temperature sufficient to melt the solder balls; and cooling the melted solder balls sufficiently to resolidify the solder balls which bond to the substrate.

2. A method as recited in claim 1 wherein the substrate comprises conductive pads arranged in the predetermined pattern.

3. A method as recited in claim 1 further comprising the steps of:

providing a carrier for the substrate; and loading the substrate into the carrier.

4. A method as recited in claim 1 wherein the step of providing an alignment plate comprises the step of providing an alignment plate having a coefficient of thermal expansion similar to the coefficient of thermal expansion of the substrate.

5. A method as recited in claim 1 further comprising the step of providing a gap between the alignment plate and the substrate.

6. A method as recited in claim 5 wherein the gap has a height equal to about 75% of the solder ball diameter.

7. A method as recited in claim 1 wherein the step of loading solder balls into each hole of the alignment plate comprises:

positioning a shutter plate comprising a plurality of through-holes in a pattern corresponding to the hole pattern on the alignment plate over the alignment plate;

affording the shutter plate movement between a first position wherein the holes of the shutter plate are offset from the holes of the alignment plate and a second position wherein the holes of the shutter plate are aligned with the holes of the alignment plate;

loading solder balls in the holes of the shutter plate when the shutter plate is in its first position; and moving the shutter plate to its second position to allow the solder balls to drop into the holes of the alignment plate and onto the substrate in the predetermined pattern.

8. A method as recited in claim 7 further comprising, after the shutter plate is moved from its first to its second position to allow the solder balls to drop into the holes of the alignment plate, the step of moving the shutter plate back to its first position.

9. A method as recited in claim 1 wherein the step of loading solder balls into each hole of the alignment plate comprises the steps of:

providing a vacuum plate having vacuum holes in a pattern which corresponds to the predetermined pattern, wherein at least a portion of each hole has a diameter smaller than the diameter of the solder balls;

establishing a vacuum within each vacuum hole;

loading a solder ball into each vacuum hole, whereby the vacuum retains the solder ball in the hole;

positioning the vacuum plate over the alignment plate so that the vacuum holes of the vacuum plate are aligned with the through holes of the alignment plate; and releasing the vacuum within the vacuum holes whereby the solder balls drop into the holes in the alignment plate and onto the substrate in the predetermined pattern.

10. A method as recited in claim 9 wherein the step of releasing further comprises the step of blowing a gas through the vacuum holes of the vacuum plate to urge the balls out of the vacuum holes.

11. A method as recited in claim 1 wherein the step of heating in a vacuum comprises removing pre-existing oxides from the surface of the solder balls without using flux.

12. A method as recited in claim 11 wherein the step of heating in a vacuum comprises the steps of:

placing into a chamber an assembly comprising of the substrate and alignment plate;

filling the chamber with at least an inert gas;

purging the chamber to a pressure below about 1 torr; and heating the substrate to a temperature of about 170° C. and maintaining said temperature for about 3 minutes.

13. A method as recited in claim 12 wherein the step of heating in an inert atmosphere comprises the steps of:

refilling the chamber with at least an inert gas to a pressure of about 1 to 4 psig;

heating the substrate to a temperature sufficient to melt the solder balls; and maintaining said temperature for about 2 minutes.

14. A method as recited in claim 13 further comprising the step of pre-purging the chamber prior to the step of filling the chamber with at least an inert gas.

15. A method as recited in claim 13 wherein the step of filling the chamber with at least an inert gas comprises the step of filling the chamber to a pressure of about 10 psig.

16. A method as recited in claim 13 wherein prior to the step of heating the substrate in a vacuum, the method comprises the step of filling and purging the chamber more than once.

17. A method as recited in claim 13 wherein the heating the substrate to a temperature sufficient to melt the solder balls comprises the step of heating the substrate to a temperature in the range of about 225–325° C. and maintaining said temperature for 2 minutes.

18. A method as recited in claim 13 wherein the step of filling the chamber with at least an inert gas comprises the step of filling the chamber with Nitrogen.

19. A method as recited in claim 13 wherein the step of refilling the chamber with at least an inert gas comprises the step of refilling the chamber with Nitrogen at about 1 to 4 psig.

20. A method as recited in claim 1 wherein the cooling the melted solder balls comprises the step of cooling the melted solder balls to resolidify each of said solder balls in an omega shape comprising a generally spherical head region and a curved neck region between the head region and the substrate surface, the maximum diameter of the neck region being smaller than the maximum diameter of the head region and wherein in the coplanarity of the solder ball interconnects is less than 10% of the average height of the solder ball interconnects.

21. A method as recited in claim 19 wherein the coplanarity of the solder ball interconnects is less than 5% of the average height of the solder ball interconnects.

22. A method as recited in claim 19 wherein each solder ball is fixedly interconnected and centered on a pad on the substrate.

23. A method as recited in claim 1 wherein the step of heating the solder balls in a vacuum comprises the step of heating the substrate for heating the solder balls, and wherein the step of heating the solder balls in an inert atmosphere comprises the step of heating the substrate for heating the solder balls.

* * * * *